United States Patent
Miyazawa et al.

(10) Patent No.: US 6,946,396 B2
(45) Date of Patent: Sep. 20, 2005

(54) MALEIC ACID AND ETHYLENE UREA CONTAINING FORMULATION FOR REMOVING RESIDUE FROM SEMICONDUCTOR SUBSTRATE AND METHOD FOR CLEANING WAFER

(75) Inventors: Tomoe Miyazawa, Funabashi (JP); Yoichiro Fujita, Funabashi (JP); Ichiro Kobayashi, Chiyoda-ku (JP)

(73) Assignee: Nissan Chemical Indusries, Ltd., Tokyo (JP)

( * ) Notice: Subject to any disclaimer, the term of this patent is extended or adjusted under 35 U.S.C. 154(b) by 71 days.

(21) Appl. No.: 10/695,773

(22) Filed: Oct. 30, 2003

(65) Prior Publication Data

US 2005/0096237 A1 May 5, 2005

(51) Int. Cl.$^7$ .......................... H01L 21/00; B08B 3/04; C09K 3/00
(52) U.S. Cl. .......................... 438/689; 134/42; 510/109
(58) Field of Search .................. 510/108, 109, 510/201, 202, 405, 461; 252/79.1; 438/689, 725; 134/1.3, 42

(56) References Cited

U.S. PATENT DOCUMENTS

| | | | |
|---|---|---|---|
| 5,334,332 A | | 8/1994 | Lee |
| 5,792,274 A | * | 8/1998 | Tanabe et al. ............... 134/1.3 |
| 5,795,702 A | * | 8/1998 | Tanabe et al. ............... 430/331 |
| 5,885,362 A | | 3/1999 | Morinaga et al. |
| 5,905,063 A | * | 5/1999 | Tanabe et al. ............... 510/176 |
| 5,968,848 A | * | 10/1999 | Tanabe et al. ............... 438/745 |
| 6,068,000 A | * | 5/2000 | Tanabe et al. ............... 134/1.3 |
| 6,218,087 B1 | * | 4/2001 | Tanabe et al. ............... 430/331 |
| 6,265,309 B1 | | 7/2001 | Gotoh et al. |
| 6,268,323 B1 | * | 7/2001 | Honda et al. ............... 510/176 |
| 6,372,050 B2 | * | 4/2002 | Honda et al. ............... 134/3 |
| 6,423,480 B2 | | 7/2002 | Ichiki |
| 6,440,856 B1 | | 8/2002 | Bessho et al. |
| 6,638,694 B2 | * | 10/2003 | Ikemoto et al. ............... 430/331 |
| 6,815,151 B2 | * | 11/2004 | Tanabe et al. ............... 430/329 |
| 2001/0014534 A1 | | 8/2001 | Aoki et al. |
| 2001/0034313 A1 | * | 10/2001 | Honda et al. ............... 510/176 |
| 2003/0143495 A1 | | 7/2003 | Ishikawa et al. |
| 2003/0186175 A1 | * | 10/2003 | Ikemoto et al. ............... 430/331 |
| 2004/0038840 A1 | * | 2/2004 | Lee et al. ............... 510/202 |

FOREIGN PATENT DOCUMENTS

| | | |
|---|---|---|
| EP | 0 662 705 B1 | 8/2000 |
| JP | 9-111224 | 4/1997 |
| JP | A 11-174690 | 7/1999 |
| JP | 11-323394 | 11/1999 |
| JP | A 2001-51429 | 2/2001 |
| JP | 2001-064685 A | 3/2001 |
| JP | 2001-209191 A | 8/2001 |
| JP | 2003-100715 A | 4/2003 |

OTHER PUBLICATIONS

MSDS for 2–Imidazolidinone (i.e. "ethylene urea"), downloaded from http://www.cdc.gov/niosh/rtecs/nj8b290.html, 4 pages.*

MSDS for "maleic acid", downloaded from http://www.jtbaker.com/msds/englishhtml/m0325.html, 8 pages.*

* cited by examiner

Primary Examiner—Evan Pert
(74) Attorney, Agent, or Firm—Oliff & Berridge, PLC

(57) ABSTRACT

A semiconductor wafer cleaning formulation for use in semiconductor fabrication comprising maleic acid and ethylene urea as essential components. The preferred formulation comprises maleic acid, ethylene urea, at least one carboxylic acid except maleic acid, at least one organic amine except ethylene urea and water. The formulation can optionally comprise at least one selected from the group consisting of an organic solvent, a chelating agent and a surfactant. The formulation is suitably used for removal of residue from semiconductor wafers following a resist ashing process, particularly for removal of residue from wafers containing delicate copper interconnect and low-k or ultra low-k interlayer dielectrics structures. There is also provided a method for cleaning the wafer by using the formulation.

25 Claims, No Drawings

MALEIC ACID AND ETHYLENE UREA CONTAINING FORMULATION FOR REMOVING RESIDUE FROM SEMICONDUCTOR SUBSTRATE AND METHOD FOR CLEANING WAFER

BACKGROUND OF THE INVENTION

1. Field of the Art

The present invention relates generally to a chemical formulation used in semiconductor wafer fabrication and particularly to a chemical formulation that is utilized to remove residue from wafers following a resist ashing process. More specifically, the present invention relates to a cleaning formulation for removal of residue from semiconductor wafers containing delicate copper interconnect and low-k or ultra low-k interlayer dielectrics structures.

2. Description of the Prior Art

As semiconductor wafer designs become smaller, Cu interconnect and low-k or ultra low-k interlayer dielectrics are being developed to improve device performance. For example, Cu/low-k single damascene or dual damascene wafers are being fabricated by etching and ashing process.

The prior art tells the utilization of various chemical formulations to remove residue and clean wafers following a resist ashing process. Some of these prior art chemical formulations are based on alkaline amines (U.S. Pat. No. 5,334,332) and ammonium fluoride (EP patent No. 662705). Still other chemical formulations are based on organic carboxylic acids (U.S. publication No. 2003/0143495 A1). These various prior art chemical formulations have drawbacks that include unwanted removal of metal like Cu or low-k and ultra low-k insulator layers whose k-value are less than 3.0. There is therefore a need for chemical formulations that effectively remove residue following a resist ashing process and do not affect on metal and low-k and ultra low-k insulator layers.

SUMMARY OF THE INVENTION

The present invention relates generally to a chemical formulation used in semiconductor wafer fabrication and particularly to a chemical formulation that is utilized to remove residue from wafers following a resist ashing process. Namely, the present invention relates to the following invention (1) to (25):

(1) A semiconductor wafer cleaning formulation for use in semiconductor fabrication comprising following components: maleic acid, and ethylene urea (2-imidazolidone);

(2) The cleaning formulation as described in (1), further comprising water;

(3) The cleaning formulation as described in (2), comprising 1–9% by weight of maleic acid and 1–20% by weight of ethylene urea;

(4) The cleaning formulation as described in (2), further comprising at least one organic carboxylic acid except maleic acid and at least one organic amine except ethylene urea;

(5) The cleaning formulation as described in (4), comprising 1–9% by weight of maleic acid, 1–20% by weight of ethylene urea, 1–20% by weight of at least one organic carboxylic acid except maleic acid, 1–50% by weight of at least one organic amine except ethylene urea, and 20–70% by weight of water;

(6) The cleaning formulation as described in (4), wherein the organic carboxylic acid is selected from the group consisting of formic acid (FA), acetic acid (AA) and propionic acid (PA);

(7) The cleaning formulation as described in (4), wherein the organic amine is selected from the group consisting of hydroxyethylpiperazine (HEP), hydroxypropylpiperazine (HPP), aminoethylpiperazine (AEP), aminopropylpiperazine (APP), hydoxyethylmorpholine (HEM), hydroxypropylmorpholine (HPM), aminoethylmorpholine (AEM), aminopropylmorpholine (APM), triethanolamine (TEA), pentamethyldiethylenetriamine (PMDETA), dimethylaminoethoxyethanol (DMAEE), aminoethoxyethanol (AEE), trimethylaminoethyletha-nolamine (TMAEEA), trimethylaminopropylethanolamine (TMAPEA), N-(2-cyanoethyl)ethylenediamine (CEEDA), and N-(2-cyanopropyl)ethylenediamine (CPEDA).

(8) The cleaning formulation as described in (4), further comprising at least one selected from the group consisting of an organic solvent, a chelating agent, and a surfactant.

(9) The cleaning formulation as described in (8), wherein the organic solvent, the chelating agent and the surfactant are contained in an amount by weight of 1–20%, 0.01–5% and 0.01–0.2%, respectively.

(10) The cleaning formulation as described in (8), wherein the organic solvent is selected from the group consisting of 1,4-butanediol (1,4-BD), 1,3-butanediol (1,3-BD), ethylene glycol (EG), propylene glycol (PG), N-methylpyroridone(NMP), γ-butyrolactone (GBL), propylene glycol monomethylether (PGME), and propylene glycol monomethylether acetate (PGMEA).

(11) The cleaning formulation as described in (8), wherein the chelating agent is selected from the group consisting of ascorbic acid, gluconic acid, mannitol, sorbitol, and boric acid.

(12) The cleaning formulation as described in (8), wherein the surfactant is selected from the group consisting of (C1–C10) alkyl glucosides.

(13–24) A method for cleaning a wafer comprising cleaning the wafer by using the chemical formulation as described in any one of (1)–(12).

(25) The method as described in (13), wherein the cleaning is carried out after a following process: (i) making via hole with etching and ashing process; (ii) making trench with etching and ashing process; (iii) punching of etch stopper layer; or (iv) CMP process after Cu deposition.

The present invention relates to formulations that are used in semiconductor wafer fabrication, and particularly to those formulations that are suitable for removing residue from wafers following a resist ashing process. Especially, these formulations are effective in the cleaning of dual damascene wafer. Fabrication processes of dual damascene structure wafer are as follows: (i) after depositions of etch stopper layer, inter layer dielectrics (ILD) and photo resist, a via hole is constructed by etching and ashing; (ii) filling a photoresist or other material in the via hole, and trench structure is constructed by the same process as above; (iii) etch stopper layer is removed by punching; and (iv) after filling Cu into the via hole and trench, overfilled Cu is polished by chemical mechanical polishing (CMP) process. After each of (i) to (iv) processes, cleaning processes are carried out. The formulation of the present invention is available in all cleaning processes mentioned above.

It is an advantage of the formulation of the present invention that it effectively removes residue following a resist ashing process. It is another advantage of the formulation that it effectively removes residue especially etch stopper punching residue following a resist ashing process. The etch stopper punching residue is often difficult to be completely removed without any damage on Cu and low-k and ultra low-k insulator layers. But the formulation can remove such an etch stopper punching residue without any damage thereon.

It is a further advantage of the formulation that it effectively removes metal oxide like Cu oxide or metal halides like Cu fluoride following a resist ashing process.

It is a further advantage of the formulation that it effectively removes metal oxide like Cu oxide remaining after CMP.

It is yet a further advantage of the formulation that it provides residue removal performance with less corrosivity on Cu than conventional acidic chemicals.

It is yet another advantage of the formulation that it provides residue removal performance with less corrosivity on low-k and ultra low-k insulator layers than conventional amine-based and ammonium fluoride-based chemicals.

It is yet another advantage of the formulation that it provides residue removal performance with lower temperature than conventional acidic chemicals.

It is yet a further advantage of the formulation that it provides residue removal performance with shorter treatment time than conventional amine-based and ammonium fluoride-based chemicals.

These and other features and advantages of the formulation will become understood to those of ordinary skill in the art upon review of the following detailed description of the preferred embodiments.

DESCRIPTION OF THE PREFERRED EMBODIMENTS

The present invention provides formulations that are suitable for removing wafer residue which originate from high-density plasma etching followed by ashing. The formulation comprises maleic acid and ethylene urea as essential components. The preferred formulation is composed of maleic acid, ethylene urea and water. That is, it is preferred that the formulation of the present invention is in a form of an aqueous solution. In addition, the preferred formulation is composed of maleic acid, ethylene urea, at least one carboxylic acid other than maleic acid, at least one other organic amine other than ethylene urea and water. This formulation can optionally comprise one, two or all of an organic solvent, a chelating agent and a surfactant.

The preferred formulations have the following components (percentage by weight):

(a) Maleic acid 1–9%;
(b) Ethylene urea 1–20%;
(c) Water 20–70%;
(d) At least one organic carboxylic acid except maleic acid 1–20%;
(e) At least one organic amine except ethylene urea 1–50%;
(f) At least one organic solvent 1–20%;
(g) At least one chelating agent 0.01–5%;
and
(h) Surfactant 0.01–0.2%.

The preferred organic carboxylic acids are formic acid (FA), acetic acid (AA) and propionic acid (PA).

The preferred organic amines are hydroxyethylpiperazine (HEP), hydroxypropylpiperazine (HPP), aminoethylpiperazine (AEP), aminopropylpiperazine (APP), hydroxyethylmorpholine (HEM), hydroxypropylmorpholine (HPM), aminoethylmorpholine (AEM), aminopropylmorpholine (APM), triethanolamine (TEA), pentamethyldiethylenetriamine (PMDETA), dimethylaminoethoxyethanol (DMAEE), aminoethoxyethanol (AEE), trimethylaminoethylethanolamine (TMAEEA), trimethylaminopropylethanolamine (TMAPEA), N-(2-cyanoethyl)ethylenediamine (CEEDA) and N-(2-cyanopropyl)ethylenediamine (CEEDA).

The preferred organic solvents are 1,4-butanediol (1,4BD), 1,3-butanediol (1,3-BD), ethylene glycol (EG), propylene glycol (PG), NMP, γ-butyrolactone(GBL), PGME and PGMEA.

The preferred chelating agents are ascorbic acid, gluconic acid, mannitol, sorbitol and boric acid.

The preferred surfactants are (C1–C10) alkyl glucosides.

Treatment temperature of the formulation is not limited to temperatures at which the formulation could remove residue completely. The preferred treatment temperature is 21–40° C.

Treatment time of the formulation is not limited while it could remove residue completely. The preferred treatment time is 1–5 min.

Treatment procedure of the formulation is not limited so long as the formulation is in contact with the surface of wafer. The formulation can be suitably applied to batch process or single wafer process.

The formulation can be used for residue removal in semiconductor fabrication, for example it is useful for (1) cleaning process after plasma etch of low-k and ultra low-k insulator layer and other layers, (2) cleaning process after plasma etch of etch stopper layer, (3) cleaning process after ashing a resist from the surface of the wafer, (4) cleaning process after Cu CMP process.

EXAMPLES

The present invention is explained with some examples described below, but this invention is not limited to these examples.

(1) Cu oxide removal test

Cu blanket wafers were treated with O2 plasma (250° C., 120 sec) and Cu oxide wafers were prepared. Each wafer was immersed into various formulations (examples 1–14, comparative examples 1–5) at 40° C., 2 min. After that each wafer was rinsed with deionized water and dried. Cu oxide removal ability was determined with optical microscopic observation and oxidization state of Cu surface measured with X-ray photoelectron spectroscopy (XPS; Shimadzu ESCA-3200).

The components of examples 1–13 and comparative example 1–5 are shown in Tables 1–3. And the judgments of Cu oxide removal ability are described below:

R: Removed; Yellow colored surface of wafer (from OM observation), No Cu (II) peaks in XPS spectra.

NR: Not Removed; Red colored surface of wafer, remain of Cu (II) peaks in XPS spectra.

TABLE 1

(Each value shows percentage by weight)

| Example | 1 | 2 | 3 | 4 | 5 | 6 | 7 | 8 | 9 | 10 | 11 | 12 | 13 |
|---|---|---|---|---|---|---|---|---|---|---|---|---|---|
| Water | 55 | 55 | 55 | 55 | 55 | 55 | 55 | 55 | 55 | 55 | 55 | 55 | 55 |
| Maleic acid | 5 | 5 | 5 | 5 | 5 | 5 | 5 | 5 | 5 | 5 | 5 | 5 | 5 |
| Ethylene urea | 5 | 5 | 20 | 5 | 5 | 5 | 5 | 5 | 5 | 5 | 5 | 5 | 5 |
| Formic acid | 10 | 10 | 10 | 10 | 10 | 10 | 10 | 10 | 10 | 10 | 10 | 10 | 10 |
| 1,4-Buthanediol | — | — | — | — | — | 5 | 5 | — | — | — | — | — | — |
| Ethylene glycol | — | — | — | — | — | — | — | 5 | 5 | — | — | — | — |
| Triethanolamine | 20 | 20 | 5 | — | — | — | — | 15 | 15 | 15 | 15 | 20 | 20 |
| TMAEEA | — | — | — | 20 | 20 | 15 | 15 | — | — | — | — | — | — |
| AEM | 5 | — | 5 | 5 | — | 5 | — | 5 | — | 5 | 5 | 5 | 5 |
| AEP | — | 5 | — | — | 5 | — | 5 | — | 5 | — | — | — | — |
| Gluconic acid | — | — | — | — | — | — | — | — | — | 5 | — | — | — |
| Mannitol | — | — | — | — | — | — | — | — | — | — | 5 | — | — |
| Methyl glucoside | — | — | — | — | — | — | — | — | — | — | — | 0.15 | — |
| Decyl glucoside | — | — | — | — | — | — | — | — | — | — | — | — | 0.15 |
| Cu oxide removal | R | R | R | R | R | R | R | R | R | R | R | R | R |

TABLE 2

| | Comparative example | | |
|---|---|---|---|
| | 1 | 2 | 3 |
| Water | 55 | 55 | 55 |
| Maleic acid | — | — | 5 |
| Malonic acid | 5 | — | — |
| Acrylic acid | — | 5 | — |
| Ethylene urea | 5 | 5 | — |
| Formic acid | 10 | 10 | — |
| Triethanolamine | 20 | 20 | 20 |
| AEM | 5 | 5 | 15 |
| Cu oxide removal | NR | NR | NR |

TABLE 3

| | Comparative example | |
|---|---|---|
| | 4 | 5 |
| Water | 29 | — |
| Ammonium Fluoride | 1 | — |
| Dimethylacetamide | 60 | — |
| Diethylene glycol-monomethylether | 10 | — |
| Monoethanolamine | — | 30 |
| Dimethylsulfoxide | — | 70 |
| Cu oxide removal | NR | NR |

(2) Residue removal test

Cu/low-k patterned wafers after punching the etch stopper layer were used for evaluation of the formation of the present invention. The wafers were immersed into any one of the formulations of Examples 1–13 at 40° C. for 5 min. Then, each wafer was rinsed with deionized water and dried, residue removal ability or Cu, low-k or ultra low-k corrosivity was determined with scanning electron microscopic (SEM) observation.

The formulations of the present invention could remove residue without any corrosion of Cu, low-k or ultra low-k. Sidewall polymer residue could also be removed simultaneously.

As mentioned above, it is clear that the formulations of the present invention are excellent in low corrosivity and removal ability of residue in a wafer cleaning process.

While the present invention has been described with reference to certain preferred embodiments, it will be understood by those skilled in the art that various alternations and modifications may be made therein without departing from the true spirit and scope of the invention. It is therefore intended that the following claims cover all such alternations and modifications, which nevertheless include the true spirit and scope of the invention.

What is claimed is:

1. A semiconductor wafer cleaning formulation for use in semiconductor fabrication comprising following components:
   maleic acid, and
   ethylene urea.
2. The cleaning formulation according to claim 1, wherein the formulation is an aqueous solution.
3. The cleaning formulation according to claim 2, comprising
   1–9% by weight of maleic acid; and
   1–20% by weight of ethylene urea.
4. The cleaning formulation according to claim 2, further comprising at least one organic carboxylic acid except maleic acid, and
   at least one organic amine except ethylene urea.
5. The cleaning formulation according to claim 4, comprising
   1–9% by weight of maleic acid;
   1–20% by weight of ethylene urea;
   1–20% by weight of at least one organic carboxylic acid except maleic acid;
   1–50% by weight of at least one organic amine except ethylene urea; and
   20–70% by weight of water.
6. The cleaning formulation according to claim 4, wherein the organic carboxylic acid is selected from the group consisting of:
   formic acid (FA),
   acetic acid (AA), and
   propionic acid (PA).
7. The cleaning formulation according to claim 4, wherein the organic amine is selected from the group consisting of:
   hydroxyethylpiperazine (HEP),
   hydroxypropylpiperazine (HPP),
   aminoethylpiperazine (AEP),
   aminopropylpiperazine (APP),
   hydroxyethylmorpholine (HEM), hydroxypropylmorpholine (HPM),
aminoethylmorpholine (AEM),
aminopropylmorpholine (APM),
triethanolamine (TEA),
pentamethyldiethylenetriamine (PMDETA),
dimethylaminoethoxyethanol (DMAEE),
aminoethoxyethanol (AEE),
trimethylaminoethylethanolamine (TMAEEA),
trimethylaminopropylethanolamine (TMAPEA),
N-(2-cyanoethyl)ethylenediamine (CEEDA), and
N-(2-cyanopropyl)ethylenediamine (CPEDA).

8. The cleaning formulation according to claim 4, further comprising at least one selected from the group consisting of:
an organic solvent,
a chelating agent, and
a surfactant.

9. The cleaning formulation according to claim 8, wherein the organic solvent, the chelating agent and the surfactant are contained in an amount by weight of 1–20%, 0.01–5% and 0.01–0.2%, respectively.

10. The cleaning formulation according to claim 8, wherein the organic solvent is selected from the group consisting of:
1,4-butanediol (1,4-BD),
1,3-butanediol (1,3-BD),
ethylene glycol (EG),
propylene glycol (PG),
N-methylpyroridone(NMP),
γ-butyrolactone (GBL),
propylene glycol monomethylether (PGME), and
propylene glycol monomethylether acetate (PGMEA).

11. The cleaning formulation according to claim 8, wherein the chelating agent is selected from the group consisting of:
ascorbic acid,
gluconic acid,
mannitol,
sorbitol, and
boric acid.

12. The cleaning formulation according to claim 8, wherein the surfactant is selected from the group consisting of:
(C1–C10) alkyl glucosides.

13. A method for cleaning a wafer comprising:
cleaning the wafer by using a chemical formulation including the following components:
maleic acid, and
ethylene urea.

14. The method according to claim 13, wherein the formulation is an aqueous solution.

15. The method according to claim 14, wherein the formulation comprises
1–9% by weight of maleic acid; and
1–20% by weight of ethylene urea.

16. The method according to claim 14, wherein the formulation further comprises:
at least one organic carboxylic acid except maleic acid, and
at least one organic amine except ethylene urea.

17. The method according to claim 16, wherein the formulation comprises:
1–9% by weight of maleic acid;
1–20% by weight of ethylene urea;
1–20% by weight of at least one organic carboxylic acid except maleic acid;
1–50% by weight of at least one organic amine except ethylene urea; and
20–70% by weight of water.

18. The method according to claim 16, wherein the organic carboxylic acid is selected from the group consisting of:
formic acid (FA),
acetic acid (AA), and
propionic acid (PA).

19. The method according to claim 16, wherein the organic amine is selected from the group consisting of:
hydroxyethylpiperazine (HEP),
hydroxypropylpiperazine (HPP),
aminoethylpiperazine (AEP),
aminopropylpiperazine (APP),
hydroxyethylmorpholine (HEM),
hydroxypropylmorpholine (HPM),
aminoethylmorpholine (AEM),
aminopropylmorpholine (APM),
triethanolamine (TEA),
pentamethyldiethylenetriamine (PMDETA),
dimethylaminoethoxyethanol (DMAEE),
aminoethoxyethanol (AEE),
trimethylaminoethylethanolamine (TMAEEA),
trimethylaminopropylethanolamine (TMAPEA),
N-(2-cyanoethyl)ethylenediamine (CEEDA), and
N-(2-cyanopropyl)ethylenediamine (CEEDA).

20. The method according to claim 16, wherein the formulation further comprises at least one selected from the group consisting of:
an organic solvent,
a chelating agent, and
a surfactant.

21. The method according to claim 20, wherein the organic solvent, the chelating agent and the surfactant are contained in an amount by weight of 1–20%, 0.01–5% and 0.01–0.2%, respectively.

22. The method according to claim 20, wherein the organic solvent is selected from the group consisting of:
1,4-butanediol (1,4-BD),
1,3-butanediol (1,3-BD),
ethylene glycol (EG),
propylene glycol (PG),
NMP,
γ-butyrolactone (GBL),
PGME, and
PGMEA.

23. The method according to claim 20, wherein the chelating agent is selected from the group consisting of:
ascorbic acid,
gluconic acid,
mannitol,
sorbitol, and
boric acid.

24. The method according to claim 20, wherein the surfactant is selected from the group consisting of:

(C1–C10) alkyl glucosides.

25. The method according to claim 13, wherein the cleaning is carried out after a following process: (i) making via hole with etching and ashing process; (ii) making trench with etching and ashing process; (iii) punching of etch stopper layer; or (iv) CMP process after Cu deposition.

* * * * *